United States Patent
Ayraud (10) Patent No.: US 9,496,827 B2
(45) Date of Patent: Nov. 15, 2016

(54) RADIO FREQUENCY SIGNAL POWER AMPLIFICATION CIRCUIT

(71) Applicant: STMicroelectronics (Grenoble 2) SAS, Grenoble (FR)

(72) Inventor: Michel Ayraud, Voreppe (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 14/956,826

(22) Filed: Dec. 2, 2015

(65) Prior Publication Data

US 2016/0308493 A1 Oct. 20, 2016

(30) Foreign Application Priority Data

Apr. 14, 2015 (FR) ...................... 15 53236

(51) Int. Cl.

| H03F 1/14 | (2006.01) |
|---|---|
| H03F 3/04 | (2006.01) |
| H03F 1/02 | (2006.01) |
| H03F 3/217 | (2006.01) |
| H03F 3/21 | (2006.01) |
| H03F 3/193 | (2006.01) |

(52) U.S. Cl.
CPC ............ H03F 1/0205 (2013.01); H03F 3/193 (2013.01); H03F 3/211 (2013.01); H03F 3/2171 (2013.01); *H03F 2200/451* (2013.01); *H03F 2203/21103* (2013.01)

(58) Field of Classification Search
CPC .................................. H03F 1/14; H03F 3/04
USPC .......................................... 330/251, 302, 51
See application file for complete search history.

(56) References Cited

U.S. PATENT DOCUMENTS

| 6,381,286 | B1 | 4/2002 | Wilkinson et al. |
| 6,853,836 | B2 | 2/2005 | Asam et al. |
| 2003/0048138 | A1* | 3/2003 | Van De Westerlo ..... H03F 1/22 330/311 |
| 2006/0119435 | A1* | 6/2006 | Oh .......................... H03F 1/223 330/311 |
| 2006/0132111 | A1* | 6/2006 | Jacobs .................... G05F 1/618 323/282 |
| 2011/0003563 | A1* | 1/2011 | Gorbachov ........ H01Q 21/0025 455/78 |
| 2011/0095826 | A1* | 4/2011 | Hadjichristos .......... H03F 1/523 330/279 |
| 2011/0133570 | A1* | 6/2011 | Mayo .................... H03F 3/2176 307/104 |
| 2015/0340992 | A1* | 11/2015 | Korol .................... H03F 1/0205 330/296 |
| 2016/0211813 | A1* | 7/2016 | Gonzalez Jimenez .. H03H 7/40 |

* cited by examiner

*Primary Examiner* — Patricia T Nguyen
(74) *Attorney, Agent, or Firm* — Gardere Wynne Sewell LLP (57) ABSTRACT

An RF amplifier includes a branch with an inductor series-connected with a capacitor between first and second power supply nodes, a junction point between the inductor and capacitor forming an output node. A further branch includes a MOS transistor series-connected with a switch between the output node and the second power supply node. The switch has a control node coupled to receive a first input signal. The MOS transistor has a gate coupled to receive a second input signal. A control circuit applies the power supply voltage as the second input signal when a frequency/phase-modulated signal is applied as the first input signal. The control circuit further applies a variable signal as the second input signal when a radio frequency signal of constant frequency, phase, and amplitude is applied as the first input signal, and in this mode the MOS transistor is constrained to operate as a current source.

20 Claims, 3 Drawing Sheets

RADIO FREQUENCY SIGNAL POWER AMPLIFICATION CIRCUIT

PRIORITY CLAIM

This application claims the priority benefit of French Application for Patent No. 1553236, filed on Apr. 14, 2015, the contents of which is hereby incorporated by reference in its entirety to the maximum extent allowable by law.

TECHNICAL FIELD

The present disclosure relates to the field of wireless communications, and more specifically to devices for transmitting radio frequency signals. The present disclosure more specifically relates to the power amplification of radio frequency signals for the transmission thereof.

BACKGROUND

A radio frequency signal transmission device conventionally comprises a digital and/or analog circuit for generating radio frequency signals to be transmitted, a power analog circuit for amplifying the radio frequency signals, and an antenna coupled to the output of the power amplifier, generally via an impedance matching and/or harmonics filtering circuit.

The radio frequency signals transmitted by such a device may be frequency-modulated signals or phase-modulated signals, that is, alternative current (AC) signals of constant amplitude, the data to be transmitted being coded by variations of the signal frequency or phase.

As a variation, the transmitted radio frequency signals may be amplitude-modulated signals, that is, AC signals of constant frequency, the data to be transmitted being coded by amplitude variations of the signal.

In a device transmitting frequency-modulated signals or phase-modulated signals, the power amplifier may be a so-called class-E amplifier. This type of amplifier indeed has a good efficiency for the amplification of radio frequency signals of constant amplitude.

Class-E amplifiers however have no linear operating state, and are thus not adapted to the amplification of amplitude-modulated radio frequency signals.

In certain applications, it is desired to alternately transmit frequency-modulated radio frequency signals or phase-modulated radio frequency signals, or amplitude-modulated radio frequency signals.

To achieve this, a possible solution is to provide two different power amplifiers, one adapted to the amplification of the frequency-modulated signals or phase-modulated signals, and the other adapted to the amplification of the amplitude-modulated signals. This may however raise problems of cost, bulk, and/or electric power consumption.

SUMMARY

Thus, an embodiment provides a radio frequency signal amplifier, comprising: a first branch comprising an inductance series-connected with a first capacitor between first and second nodes of application of a direct current (DC) power supply voltage, the junction point of the inductance and of the first capacitor forming an output node of the amplifier, intended to be coupled to a load; a second branch comprising a first MOS transistor series-connected with a first switch between the output node and the second power supply node, the first switch having a control node coupled to a first node of application of an input signal, and the first MOS transistor having its gate coupled to a second node of application of an input signal; and a circuit for delivering a binary signal representative of the sign of the difference between the drain-source voltage of the first transistor and the gate-source voltage minus the threshold voltage of the first transistor.

According to an embodiment, the first transistor is capable of operating as a current source controllable via the second input node.

According to an embodiment, the first switch is a MOS transistor capable of operating as a switch, having its gate coupled to the first input node.

According to an embodiment, the gate oxide of the first MOS transistor is thicker than the gate oxide of the MOS transistor forming the first switch.

According to an embodiment, the circuit comprises: a second capacitor and a second switch capable of sampling a voltage representative of the voltage taken by the output node when the first switch is in the on state; and a second MOS transistor, of the same type as the first MOS transistor, diode-mounted and biased to its conduction threshold, the drain of the second diode-mounted transistor being coupled to the gate of the first transistor.

According to an embodiment, the second capacitor has a first electrode coupled to the second power supply node and a second electrode connected to the output node by the second switch; and the source of the second diode-mounted transistor is connected to the second power supply node by a current source, the amplifier further comprising a comparator having a first input connected to the second electrode of the second capacitor, and having a second input connected to the source of the second diode-mounted transistor.

According to an embodiment, the second capacitor has a first electrode coupled to the second power supply node and a second electrode coupled to the midpoint of a first voltage dividing bridge coupling the output node to the second power supply node; and the source of the second diode-mounted transistor is coupled to the second power supply node by a second voltage-dividing bridge, the amplifier further comprising a comparator having a first input coupled to the second electrode of the second capacitor, and having a second input coupled to the midpoint of the second voltage dividing bridge.

According to an embodiment, the binary signal is an output signal of said comparator.

According to an embodiment, the second switch has a control node coupled to the control node of the first switch.

Another embodiment provides a radio frequency signal transmission device comprising an amplifier of the above-mentioned type, this device being capable of controlling the amplifier alternately: to a first operating mode when the gate of the first transistor is coupled to the first power supply node, and wherein a frequency- or phase-modulated radio frequency signal is applied to the first input node; and to a second operating mode where a radio frequency signal of constant frequency, phase, and amplitude is applied to the first input node, a variable signal for controlling the current delivered by the second transistor being applied to the second input node.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

The same elements have been designated with the same reference numerals in the different drawings and, further, the various drawings are not to scale. For clarity, only those elements which are useful to the understanding of the described embodiments have been shown and are detailed. In particular, when radio frequency signal transmission devices are shown and described, only the circuits for amplifying the power of the radio frequency signals are detailed. The circuits arranged upstream and downstream of the power amplifier are not detailed, the described embodiments being compatible with usual circuit arranged upstream and downstream of a radio frequency signal power amplifier. In the present description, radio frequency signals are signals having a frequency in the range from 3 kHz to 300 GHz, for example, signals having a frequency in the range from 100 MHz to 100 GHz. Further, in the present description, term "connected" is used to designate a direct electric connection, with no intermediate electronic component, for example, by means of one or a plurality of conductive tracks, and term "coupled" or term "linked" is used to designate either a direct electric connection (then meaning "connected") or a connection via one or a plurality of intermediate components (resistor, capacitor, transistor, etc.). Unless otherwise specified, expressions "approximately", "substantially", and "in the order of" mean to within 10%, preferably to within 5%.

Figure 1:
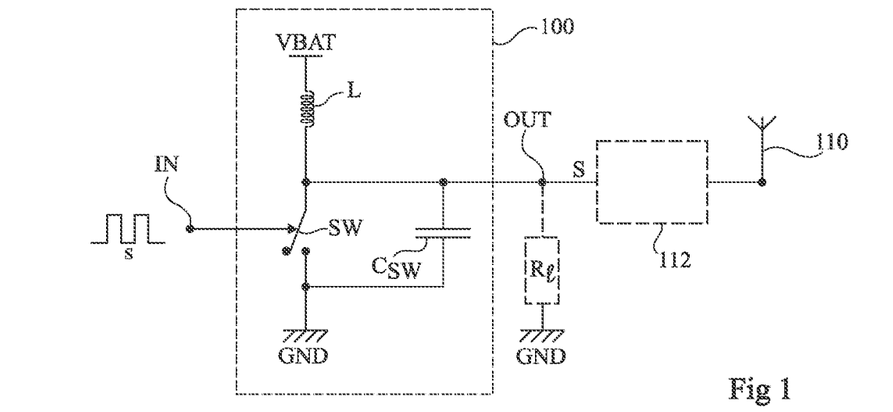
FIG. 1 is an electric diagram of an example of radio frequency transmission device capable of transmitting frequency-modulated signals or phase-modulated signals.

FIG. 1 is an electric diagram of an example of radio frequency transmission device capable of transmitting frequency-modulated signals or phase-modulated signals.

The device of FIG. 1 comprises a circuit, not shown, capable of generating a radio frequency signal s that has been frequency-modulated or phase-modulated. Signal s is an alternating current (AC) signal having a constant envelope, with frequency or phase variations coding the data to be transmitted. Input signal s for example is a square wave voltage.

The device of FIG. 1 further comprises a power amplifier 100 comprising an input node IN intended to receive signal s, and an output node OUT providing a signal S, which is an amplified image of signal s. Power amplifier 100 is a so-called class-E amplifier. Amplifier 100 comprises an inductance L in series with a capacitor $C_{SW}$ between nodes VBAT and GND of application of a direct current (DC) voltage, output node OUT of the amplifier being coupled to the junction point of inductance L and of capacitor $C_{SW}$. In the shown example, node VBAT is intended to receive the high potential of the power supply voltage, and node GND is intended to receive the low potential of the power supply voltage (for example corresponding to ground). Inductance L couples nodes VBAT and OUT, and capacitor $C_{SW}$ couples nodes OUT and GND. Amplifier 100 further comprises, in parallel with capacitor $C_{SW}$, a switch SW, for example, a MOS transistor, coupling node OUT to node GND. The control node of switch SW is coupled to input node IN of the amplifier.

The device of FIG. 1 further comprises an antenna 110 coupled to output node OUT of amplifier 100. An impedance matching and/or harmonics filtering circuit 112 may be provided between node OUT and antenna 110.

The operation of the radio frequency transmission device of FIG. 1, and more particularly of amplifier 100, will now be described in relation with FIGS. 2A, 2B, and 2C.

Figure 2A:
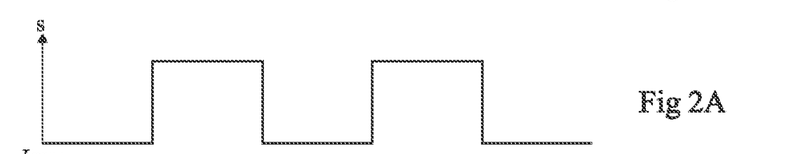
FIGS. 2A, 2B, and 2C are timing diagrams illustrating the operation of the device of FIG. 1.
Figure 2B:
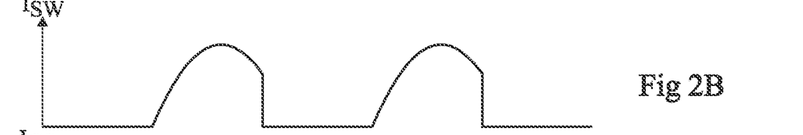
Figure 2C:
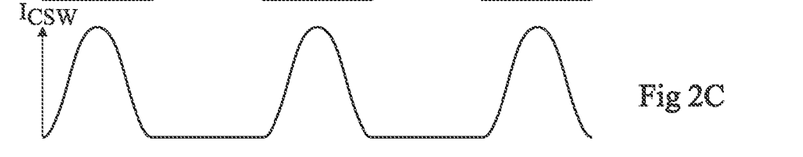

FIGS. 2A, 2B, and 2C are timing diagrams respectively showing the time variation of signal s applied at the input of amplifier 100, of current $I_{SW}$ flowing through switch SW, and of voltage $V_{CSW}$ across capacitor $C_{SW}$.

In this example, signal s is a square wave voltage, for example referenced to low power supply node GND of amplifier 100. When signal s is in the low state, switch SW is non-conductive, and current $I_{SW}$ is substantially zero. When signal s is in the high state, switch SW is on and voltage $V_{CSW}$ is substantially zero. When signal s switches from the high state to the low state, voltage $V_{SW}$ increases up to a maximum value, and then decreases until it cancels. When signal s switches from the low state to the high state, current $I_{SW}$ increases up to a maximum value, and then decreases.

The values of inductance L and of capacitor $C_{SW}$ are selected by taking into account charge impedance $R_1$ seen by output node OUT of the amplifier (for example, corresponding to the impedance of antenna 110) and the average switching frequency of switch SW, so that voltage $V_{CSW}$ is substantially zero when switch SW switches from the off state to the on state. Amplifier 100 then behaves as an RLC resonator ($R_1$, L, $C_{SW}$) synchronized by switch SW. For a given inductance L, capacitance $C_{SW}$, and power supply voltage VBAT, the envelope of the power delivered by the amplifier is constant. Thus, amplifier 100 is well adapted to the transmission of frequency-modulated radio frequency signals or phase-modulated radio frequency signals (of constant power envelope), but does not enable to amplify amplitude-modulated radio frequency signals (of variable power envelope).

Figure 3:
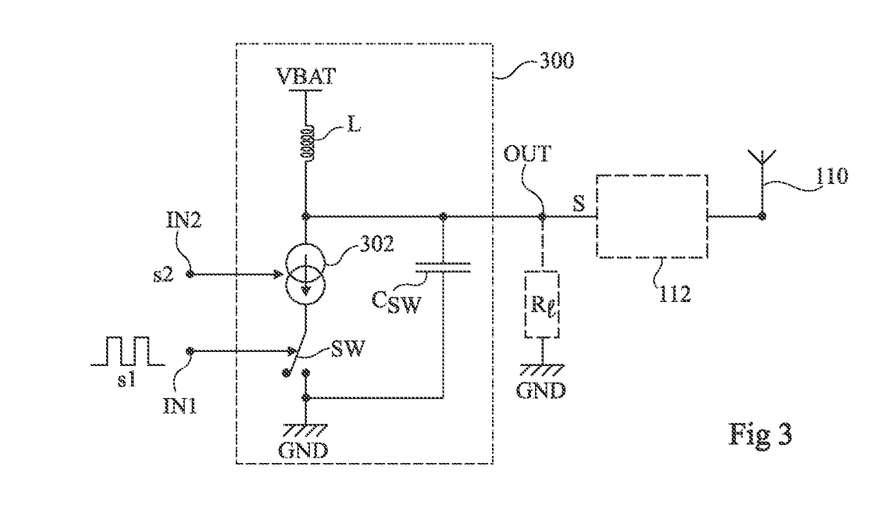
FIG. 3 is a simplified electric diagram of an example of radio frequency transmission device capable of transmitting frequency-modulated signals or phase-modulated signals and amplitude-modulated signals.

FIG. 3 is a simplified electric diagram of an example of radio frequency transmission device capable of transmitting frequency-modulated signals or phase-modulated signals and amplitude-modulated signals.

The device of FIG. 3 comprises a power amplifier 300 comprising two input nodes IN1 and IN2 intended to respectively receive signals s1 and s2 delivered by a circuit (not shown) for generating radio frequency signals to be transmitted. Amplifier 300 comprises a node OUT for delivering the amplified radio frequency signal S to be transmitted. As in the example of FIG. 1, the device of FIG. 3 comprises an antenna 110 coupled to output node OUT of the amplifier, for example, via an impedance matching and/or harmonics filtering circuit 112.

Amplifier 300 of the device of FIG. 3 comprises, as in the example of FIG. 1, an inductance L in series with a capacitor $C_{SW}$ between nodes VBAT and GND of application of a D.C.

power supply voltage, inductance L coupling node VBAT to node OUT and capacitor $C_{SW}$ coupling node OUT to node GND. Amplifier 300 further comprises, in parallel with capacitor $C_{SW}$, a switch SW.

Amplifier 300 of FIG. 3 differs from amplifier 100 of FIG. 1 essentially in that it comprises, in series with switch SW between nodes OUT and GND, a controllable current source 302, for example, a MOS transistor. In the shown example, current source 302 connects node OUT to switch SW, and switch SW connects current source 302 to node GND. The control node of switch SW is connected to input node IN1 of the amplifier, and the control node of current source 302 is coupled to input node IN2 of the amplifier.

The transmission device of FIG. 3 is capable of alternately operating in a first operating mode where the device transmits frequency-modulated radio frequency signals or phase-modulated radio frequency signals (of constant envelope), and in a second operating mode where the device transmits amplitude-modulated radio frequency signals (of variable envelope).

In the first operating mode (transmission of frequency-modulated signals or phase-modulated signals), signal s1 delivered via the radio frequency signal generation circuit and applied to input node IN1 of the amplifier corresponds to the signal to be transmitted. Signal s1 for example is a square wave voltage of constant amplitude, having its frequency and/or phase varying according to the data to be transmitted. Signal s2 is a constant signal for controlling activation of current source 302. In this operating mode, current source 302 behaves as a conductive wire or as a resistor of low value. The current flowing through switch SW is thus not limited by current source 302, and amplifier 300 substantially operates in the same way as amplifier 100 of FIG. 1.

In the second operating mode (transmission of amplitude-modulated signals), signal s1 applied to input IN1 of amplifier 300 is a periodic signal having a constant frequency, phase, and amplitude, for example, a periodic square wave AC voltage. The amplitude modulation of the radio frequency signal is applied via input IN2 of the amplifier. More particularly, signal s2 applied to node IN2 is an image of the envelope of the modulated signal to be transmitted. When the switch is in the on state (signal s1 in the high state), the current in switch SW is imposed by current source 302, the value of the imposed current varying in the same way as envelope signal s2 applied to node IN2. The power of output signal S of amplifier 300 thus varies in the same way as envelope signal s2. The device thus transmits an amplitude-modulated radio frequency signal.

Figure 4A:
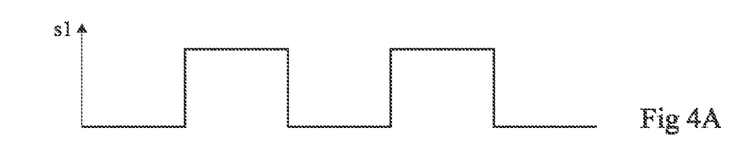
FIGS. 4A, 4B, and 4C are timing diagrams illustrating the operation of the device of FIG. 3.
Figure 4B:
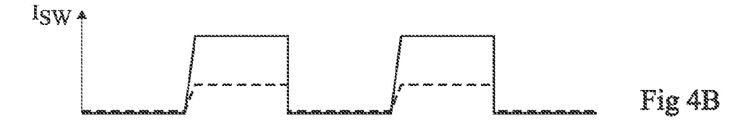
Figure 4C:
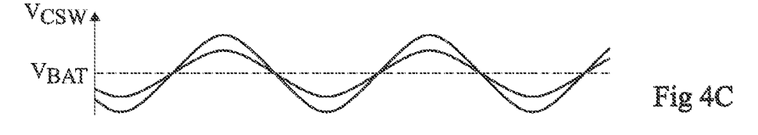

FIGS. 4A, 4B, and 4C are timing diagrams illustrating in further detail the second operating mode (transmission of amplitude-modulated signals) of the device of FIG. 3. More particularly, FIGS. 4A, 4B, and 4C respectively show the time variations of signal s1 applied to input IN1 of amplifier 300, of current $I_{SW}$ flowing through switch SW, and of voltage $V_{CSW}$ across capacitor $C_{SW}$. In FIGS. 4B and 4C, the curves in full lines show a case where current source 302 is controlled (via signal s2) to deliver a current $I_{peak1}$, and the curves in dashed lines show a case where current source 302 is controlled to deliver a current $I_{peak2}$ smaller than current $I_{peak1}$.

In this example, signal s1 is a square wave voltage, for example referenced to low power supply node GND of amplifier 300. When signal s1 is in the low state, switch SW is non-conductive, and current $I_{SW}$ is substantially zero. When signal s1 switches to the high state, switch SW turns on. Current $I_{SW}$ then rapidly increases up to the maximum value delivered by current source 302, and then remains at this value until the next switching of switch SW. Voltage $V_{CSW}$ across capacitor $C_{SW}$ periodically varies around an average value substantially equal to power supply voltage VBAT, at the frequency of signal s1, with a variation amplitude proportional to the value of the current imposed by source 302.

Thus, the device of FIG. 3 advantageously enables, by means of a same power amplifier, to transmit according to the needs of the application frequency-modulated radio frequency signals or phase-modulated radio frequency signals, or amplitude-modulated radio frequency signals.

As appears in FIGS. 4A to 4C, when the device of FIG. 3 transmits amplitude-modulated signals, resonator RLC formed by inductance L, capacitance $C_{SW}$, and charge impedance $R_1$ seen by the amplifier, is no longer synchronized with switch SW. Resonator RLC behaves as a complex current-controlled impedance. In particular, current $I_{SW}$ and current $C_{SW}$ are no longer in phase opposition, which results in a decreased efficiency with respect to the first operating mode (transmission of frequency-modulated radio frequency signals or phase-modulated radio frequency signals).

Figure 5:
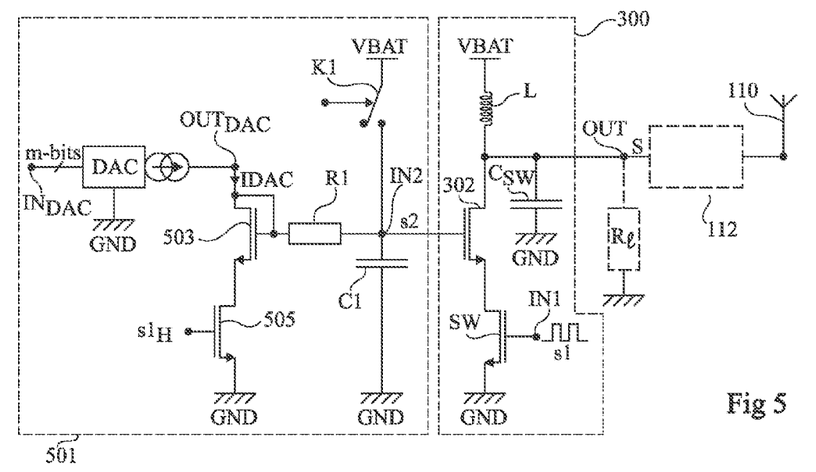
FIG. 5 is a more detailed electric diagram of an embodiment of the device of FIG. 3.

FIG. 5 is a more detailed electric diagram of an embodiment of the device of FIG. 3. In particular, FIG. 5 shows in further detail amplifier 300 of FIG. 3, and schematically and partially shows an embodiment of a circuit 501 for generating signal s2 for controlling current source 302 of amplifier 300.

In the example of FIG. 5, current source 302 is an N-channel MOS transistor having its drain connected to node OUT and having its source coupled to node GND via switch SW. In this example, switch SW is an N-channel MOS transistor having its source connected to node GND and having its drain connected to the source of transistor 302. The gate of transistor SW is connected to input node IN1 of amplifier 300, and the gate of transistor 302 is connected to input node IN2 of amplifier 300. Transistor SW, intended to operate in switched mode, preferably is a fast transistor. As an example, transistor SW is a transistor having a thinner gate oxide than transistor 302, intended to operate in linear mode.

Circuit 501 comprises a digital-to-analog converter DAC. In this example, converter DAC is a current output converter. Converter DAC comprises a digital input $IN_{DAC}$ capable of receiving a control signal over m bits, m being an integer greater than 1, and an analog output $OUT_{DAC}$ capable of delivering a current $I_{DAC}$ proportional to the digital code applied to input $IN_{DAC}$.

Circuit 501 comprises a MOS transistor 503 in series with a MOS transistor 505 between output node $OUT_{DAC}$ of converter DAC and node GND. Transistor 503 is of the same type as transistor 302 of amplifier 300, that is, in particular, it has the same conductivity type (N-channel in the shown example) and has the same gate oxide thickness and the same channel length as transistor 302. Transistor 505 is of the same type as transistor SW, that is, in particular, it is of the same conductivity type and has the same gate oxide thickness and the same channel length as transistor SW. Preferably, transistors 503, 505, 302, and SW are sized so that there is a same ratio n, preferably greater than 1, between the channel width of transistor 302 and the channel width of transistor 503, and between the channel width of transistor SW and the channel width of transistor 505. In the shown example, transistor 503 has its drain connected to node $OUT_{DAC}$ and its source connected to the drain of transistor 505, and transistor 505 has its source connected to node GND. Transistor 503 is diode-mounted, that is, its drain is connected to its gate. The gate of transistor 503 is further coupled to input node IN2 of amplifier 300 by a resistor R1. Further, a capacitor C1 couples node IN2 to node GND.

Circuit 501 further comprises a switch K1, for example, a MOS transistor, coupling node IN2 to node VBAT.

Device 300 of FIG. 5 operates as follows.

In the first operating mode (transmission of frequency-modulated signals or phase-modulated signals), switch K1 is maintained in the on state by the application of an appropriate signal to its control node. As a result, transistor 302 sees on its gate a potential substantially equal to the high power supply potential of the device. Transistor 302 then is in the lightly resistive state and operates in linear state, that is, current source 302 is deactivated. Amplifier 300 then behaves as a class-E amplifier of the type described in relation with FIG. 1, the radio frequency signal to be amplified being applied to input node IN1 of the amplifier. In particular, the power level of the transmitted signal is independent from output current $I_{DAC}$ of digital-to-analog converter DAC.

In the second operating mode (transmission of amplitude-modulated signals), switch K1 is maintained in the off state. Transistor 302 then behaves as a current source controlled by circuit 501 according to the digital code applied to input $IN_{DAC}$ of digital-to-analog converter DAC. More particularly, transistors 503 and 302 form a current mirror such that, when switch SW is in the on state (signal s1 in the high state), current $I_{SW}$ imposed by transistor 302 in switch SW is substantially equal to $n*I_{DAC}$, $I_{DAC}$ being the output current of converter DAC and n being the sizing ratio between transistors 302 and 503 on the one hand, and SW and 505 on the other hand. The operation is then similar or identical to what has been described in relation with FIG. 3, that is, a periodic radio frequency signal of constant frequency, phase, and amplitude is applied to node IN1 of the converter, the amplitude modulation of the radio frequency signal being digitally controlled via digital-to-analog converter DAC, and being applied via control node IN2 of current source 302. It should be noted that when the device operates in transmission of amplitude-modulated signals, transistor 505 can be permanently maintained in the on state by application of an appropriate control signal to its gate. Transistor 505 being a reduced image of transistor SW, to obtain a good duplication of the current between transistor 503 and transistor 302, the gate potential of transistor 505 when the latter is controlled to the on state is preferably substantially equal to the gate potential of transistor SW when the latter is conductive, that is, to high potential $s1_H$ of signal s1, for example, in the order of 1.2 V. When the device operates in frequency-modulated signal transmission or phase-modulated signal transmission, transistor 505 may be controlled to the off state. Resistor R1 and capacitor C1 form an RC filter limiting parasitic high-frequency current draws due to the switching of transistor SW.

A problem which is raised in the assembly of FIG. 5 is that, when the device is controlled to the second operating mode (transmission of amplitude-modulated radio frequency signals), it should be ascertained that transistor 302 effectively operates as a current source, that is, that it always effectively remains in its saturation operating mode (or constant current range), and does not enter its linear operation range.

Figure 6:
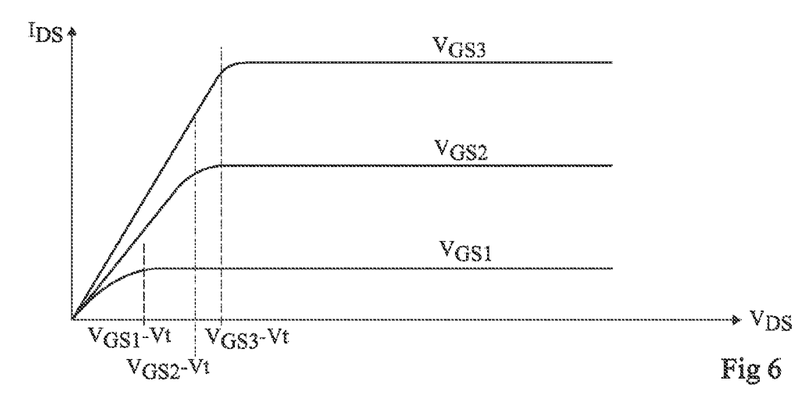
FIG. 6 is a diagram schematically illustrating the operation of a MOS transistor.

This issue is illustrated in FIG. 6 which schematically shows the curves of variation of drain-source current $I_{DS}$ according to drain-source voltage $V_{DS}$ in a MOS transistor, for three different gate-source voltages VGS1, VGS2, and VGS3 applied to the transistor. As shown in FIG. 6, for a given gate-source voltage $V_{GS}$ applied to the transistor, the transistor has a first so-called linear operation range (left-hand portion of the diagram), where current $I_{DS}$ is proportional to drain-source voltage $V_{DS}$, and a second so-called saturated operating area (right-hand portion of the diagram), where current $I_{DS}$ is approximately constant and essentially depends on the gate-source voltage $V_{GS}$ applied to the transistor.

In the amplitude modulation operating mode of the device of FIG. 5, if transistor 302 enters its linear operation range, the current flowing through transistor 302 is no longer set by control circuit 501, but particularly varies along with voltage $V_{SW}$ across capacitor $C_{SW}$. As a result, the amplitude modulation of the transmitted radio frequency signal is no longer controlled by circuit 501. A phase rotation of the radio frequency signal delivered by the amplifier further occurs. The transmitted signal is then not only amplitude-modulated, but further comprises a parasitic phase modulation, capable of polluting frequency bands close to the band used by the transmission device.

In practice, the risk for transistor 302 to enter its linear operation range is all the higher as the current requested from current source 302 is high, and as the peak-to-peak amplitude of excursion of voltage $V_{CSW}$ across capacitor $C_{SW}$ is high. However, for a given current intensity delivered by current source 302, the excursion of voltage $V_{CSW}$ across capacitor $C_{SW}$ depends on impedance $R_1$ of the load seen by output node OUT of amplifier 300, which itself strongly depends on the environment of antenna 110. Thus, the highest digital control code which may be applied to the input of digital-to-analog converter DAC before transistor 302 enters is linear operation range depends on the environment of the transmission device.

As shown in FIG. 6, a MOS transistor enters its linear operation range when its drain-source voltage $V_{DS}$ becomes lower than the difference between its gate-source voltage $V_{GS}$ and its threshold voltage Vt.

According to an aspect of an embodiment, amplifier 300 comprises a circuit capable of comparing drain-source voltage $V_{DS}$ of transistor 302 with the difference between gate-source voltage $V_{GS}$ and threshold voltage Vt of this transistor, which enables to determine whether transistor 302 is in its linear operation range or in its saturated operation range.

Figure 7:
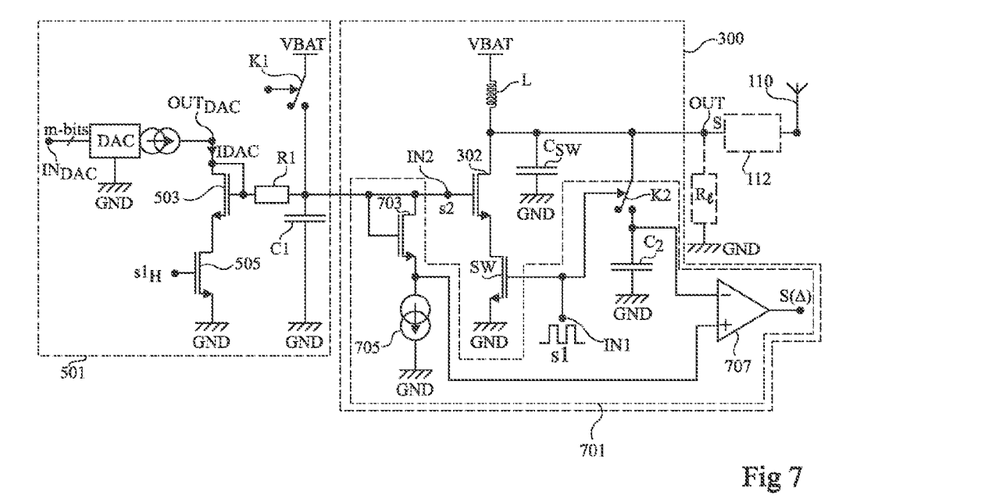
FIG. 7 is a simplified electric diagram of an embodiment of radio frequency transmission device capable of transmitting frequency-modulated signals or phase-modulated signals and amplitude-modulated signals.

FIG. 7 is a simplified electric diagram of an embodiment of radio frequency transmission device capable of transmitting frequency-modulated signals or phase-modulated signals and amplitude-modulated signals.

The device of FIG. 7 comprises the same elements as the device of FIG. 5, arranged substantially in the same way. The device of FIG. 7 differs from the device of FIG. 5 in that, in the device of FIG. 7, amplifier 300 further comprises a circuit 701 capable of comparing drain-source voltage $V_{DS}$ of transistor 302 with the difference between gate-source voltage $V_{GS}$ and threshold voltage Vt of this transistor. More particularly, circuit 701 comprises an output node capable of delivering a binary signal S(Δ) representative of the sign of difference $\Delta=(V_{GS}-Vt)-V_{DS}$.

Value $\Delta=(V_{GS}-Vt)-V_{DS}$ can be expressed as follows: $\Delta=(V_G-V_S-Vt)-(V_D-V_S)=V_G-Vt-V_D$, $V_G$, $V_S$, and $V_D$ respectively being the gate voltage, the source voltage, and the drain voltage of transistor 302. In this example, the drain of transistor 302 being connected to output node OUT of amplifier 300, voltage $V_D$ corresponds to the output voltage of amplifier 300. Further, the gate of transistor 302 being connected to input node IN2 of amplifier 300, voltage $V_G$ corresponds to the voltage of input node IN2 of the amplifier.

Circuit 701 of the device of FIG. 7 comprises a sampling capacitor C2 having an electrode coupled to node OUT via a switch K2, for example, a MOS transistor, and having its other electrode coupled to node GND. The control node of switch K2 is coupled to input node IN1 of amplifier 300. Circuit 701 further comprises a reference transistor 703 of the same type as transistor 302, that is, particularly, of the same conductivity type (N channel in the shown example) and having the same gate oxide thickness and the same channel length as transistor 302. In the shown example, the drain of transistor 703 is connected to node IN2, and the source of transistor 703 is coupled to node GND via a current source 705, for example, a resistor. Transistor 703 is diode-mounted, that is, its drain is connected to its gate. Circuit 701 further comprises a comparator 707 having a first input, for example, the positive input (+) coupled to the source of transistor 703, and having its second input, for example, the negative input (−) coupled to the electrode of capacitor C2 opposite to node GND (that is, the electrode coupled to node OUT by switch K2). The output of comparator 707 is the node for delivering binary output signal $S(\Delta)$ of circuit 701.

Circuit 701 operates as follows.

When the device of FIG. 7 operates in transmission of amplitude-modulated radio frequency signals (switch K1 off), switch K2, controlled by the same signal s1 as switch SW, switches at the same frequency as switch SW. The voltage of node OUT, during phases when a current flows through transistor 302 (that is, when switch SW is in the on state), is then sampled in capacitor C2. It should indeed be noted that to determine the operation range of transistor 302, voltage $V_{DS}$ to be compared with voltage $V_{GS}$–Vt is voltage $V_{DS}$ in the conductive state of transistor 302. Capacitor C2 thus charges to a voltage substantially equal to drain voltage $V_D$ of transistor 302. Further, current source 705 biases reference transistor 703 to the conductive state by imposing the flowing of a small current, for example, in the order of 1 µA, in transistor 302. The voltage between the drain and the source of transistor 703 is then substantially equal to the threshold voltage of this transistor, which is the same as threshold voltage Vt of transistor 302 (transistors 302 and 703 being of same nature). The voltage on the source node of transistor 703 is then substantially equal to the voltage on node IN2 minus threshold voltage Vt of transistor 703, that is, to value $V_G$–Vt.

Comparator 707 thus sees on its negative input drain voltage $V_D$ of transistor 302, and, on its positive input, the difference between gate voltage $V_G$ and threshold voltage Vt of transistor 302. If output signal $S(\Delta)$ of comparator 707 is in the high state, that is, voltage $V_D$ is smaller than voltage $V_G$–Vt, it can be deduced that transistor 302 operates in linear state. If output signal $S(\Delta)$ of comparator 707 is in the low state, that is, voltage $V_D$ is greater than voltage $V_G$–Vt, it can be deduced that transistor 302 effectively operates as a current source.

As an example, it can be provided, during a calibration phase, to determine the highest digital control code which can be applied to the input of digital-to-analog converter DAC without for transistor 302 to enter a linear operating mode. To achieve this, it may for example be provided to progressively increment the control code applied at the input of the DAC converter, until the output of circuit 701 switches state. As a variation, the search for the largest usable control code may be performed by dichotomy, or by any other adapted search technique. Once the largest usable digital control code has been determined, the latter may be stored by a control circuit (not shown). The circuit for generating radio frequency signals to be transmitted can then be configured to never exceed this code. The calibration of the transmission device may for example be regularly repeated, to adapt to possible variations of the environment of the device.

Means, not shown, for deactivating circuit 701 may optionally be provided. As an example, it may particularly be provided to deactivate circuit 701 out of calibration phases and/or when the device operates in transmission of frequency-modulated radio frequency signals or phase-modulated radio frequency signals.

Figure 8:
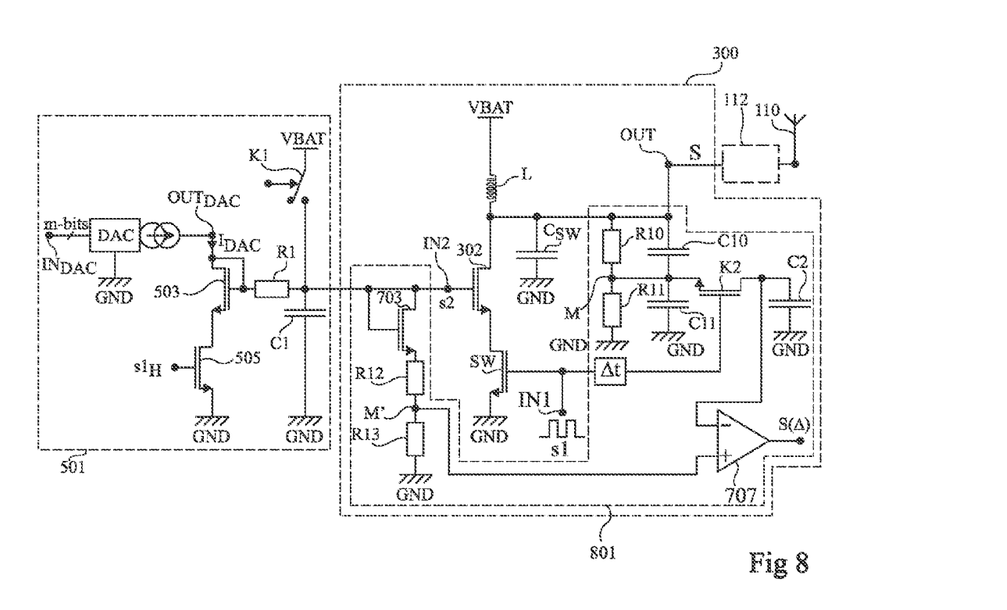
FIG. 8 is an electric diagram of an alternative embodiment of the device of FIG. 7.

FIG. 8 is an electric diagram showing an alternative embodiment of the device of FIG. 7. The device of FIG. 8 comprises elements common with the device of FIG. 7. These elements will not be detailed again hereafter.

The device of FIG. 8 enables to release the constraints bearing on switch K2 of FIG. 7, which should be able to withstand voltages which may be a plurality of times greater than power supply voltage VBAT.

The device of FIG. 8 differs from the device of FIG. 7 essentially in that circuit 701 of FIG. 7 is replaced with a circuit 801, also capable of determining the sign of difference $\Delta=(V_{GS}-Vt)-V_{DS}$ characterizing the operating state of transistor 302, but having an architecture different from that of circuit 701 of FIG. 7.

Circuit 801 of FIG. 8 comprises elements common with circuit 701 of FIG. 7. In the following, only the differences between circuits 801 and 701 will be detailed.

Circuit 801 of the device of FIG. 8 comprises a resistive and capacitive voltage dividing bridge comprising a first branch comprising a resistor R10 in series with a resistor R11 between node OUT and node GND and, in parallel with the first branch, a second branch comprising a capacitor C10 in series with a capacitor C11 between node OUT and node GND, junction point M of resistors R10 and R11 of the first branch being connected to the junction point of capacitors C10 and C11 of the second branch. Resistor R10 and capacitor C10 are connected to node OUT, and resistor R11 and capacitor C11 are connected to node GND. As an example, ratio R10/R11 of the values of the resistors of the first branch is substantially equal to ratio C11/C10 of the values of the capacitances of the second branch. Thus, the voltage of node M is an image reduced, for example, by a factor in the order of 10, of the voltage of node OUT.

Thus, the voltage divider enables to replace switch K2 of FIG. 7 with a switch K2 of smaller size, for example a simple thin-oxide MOS transistor, for example, of same type as transistor SW, capable of being controlled by a signal of low voltage level, for example, in the order of 1.2 V.

A difference between circuit 801 of FIG. 8 and circuit 701 of FIG. 7 is that, in circuit 801, the electrode of sampling capacitor C2 opposite to node GND, instead of being coupled, via switch K2, to node OUT as in the example of FIG. 7, is connected to node M.

Further, in circuit 801 of FIG. 8, current source 705 is replaced with the series association of two resistors R12 and R13, coupling the source of transistor 703 to node GND. Resistor R12 is connected to the source of transistor 703, and resistor R13 is connected to node GND. Resistors R12 and R13 are selected so that ratio R12/R13 is substantially equal to ratio R10/R11. Thus, the voltage of junction point M' of resistors R12 and R13 is a reduced image of the source voltage of transistor 703, the division factor between the source voltage of transistor 703 and the voltage of node M' being substantially the same as the division factor between the voltage of node OUT and the voltage of node M.

In circuit 801, the positive input of comparator 707, instead of being connected to the source of transistor 703 as in the example of FIG. 7, is connected to node M'.

Thus, circuit 801 of FIG. 8 differs from circuit 701 of FIG. 7 in that, in circuit 801, comparator 707, instead of directly comparing voltages $V_D$ and $V_G$–Vt as in the example of FIG. 7, compares reduced images of these voltages. This eases the implementation of the voltage sampling and comparison operations.

As a non-limiting example, resistors R1, R10, R11, R12, R13 and capacitors C1, C2, C10, C11 have values respectively in the range from 1 to 2 kΩ, 9 kΩ, 1 kΩ, 900 kΩ, 100 kΩ, 100 pF, 1 pF, 50 fF, and 450 fF.

The control signal of switch K2 of circuit 801 may be optionally delayed by a delay Δt, for example, in the range from 10 to 100 picoseconds, with respect to the control signal of switch SW, to compensate for a possible off-centering between the voltage of node M' and the sampling window of this voltage.

Specific embodiments have been described. Various alterations, modifications, and improvements will occur to those skilled in the art. In particular, the described embodiments are not limited to the examples described in relation with FIGS. 7 and 8 of circuits capable of determining the sign of difference $\Delta=(V_{GS}-Vt)-V_{DS}$ characterizing the operating state of transistor 302.

Further, although only embodiments where the MOS transistors of the radio frequency signal transmission device are N-channel transistors, it will be within the abilities of those skilled in the art to obtain the desired operation by replacing all or part of the N-channel MOS transistors with P-channel MOS transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A radio frequency signal power amplifier, comprising:
   a first branch comprising an inductor series-connected with a first capacitor between a first node and a second node of application of a direct current (DC) power supply voltage, wherein a junction point of the inductor and the first capacitor forms an output node of the amplifier that is configured to be coupled to a load;
   a second branch comprising a first MOS transistor series-connected with a first switch between the output node the second node, the first switch having a control node coupled to a first input node configured to receive a first input signal, the first MOS transistor having a gate coupled to a second input node configured to receive a second input signal; and
   a circuit configured to generate a binary signal indicative of a sign of a difference between a drain-source voltage of the first transistor and a gate-source voltage minus a threshold voltage of the first transistor.

2. The amplifier of claim 1, wherein the first MOS transistor is configured to operate as a controllable current source in response to the second input signal at the second input node.

3. The amplifier of claim 1, wherein the first switch is a second MOS transistor configured to operate as a switching element in response to the first input signal at the first input node applied to a gate of said second MOS transistor.

4. The amplifier of claim 3, wherein a gate oxide of the first MOS transistor is thicker than a gate oxide of the second MOS transistor.

5. The amplifier of claim 1, wherein said circuit comprises:
   a second capacitor and a second switch configured to sample a voltage representative of a voltage at the output node when the first switch is in the on state; and
   a second MOS transistor, of a same type as the first MOS transistor, that is diode-mounted and biased to a conduction threshold, a drain of the second MOS transistor being coupled to a gate of the first MOS transistor.

6. The amplifier of claim 5, wherein:
   the second capacitor has a first electrode coupled to the second power supply node and a second electrode coupled to the output node by the second switch; and
   a source of the second MOS transistor is coupled to the second power supply node by a current source, and
   further comprising a comparator having a first input coupled to the second electrode of the second capacitor and a second input coupled to the source of the second MOS transistor.

7. The amplifier of claim 6, wherein said binary signal is an output signal of said comparator.

8. The amplifier of claim 5, wherein:
   the second capacitor has a first electrode coupled to the second power supply node and a second electrode coupled to a midpoint of a first voltage dividing bridge circuit that couples the output node to the second power supply node; and
   a source of the second MOS transistor is coupled to the second power supply node by a voltage dividing bridge circuit, and
   further comprising a comparator having a first input coupled to the second electrode of the second capacitor and a second input coupled to the midpoint.

9. The amplifier of claim 8, wherein said binary signal is an output signal of said comparator.

10. The amplifier of claim 4, wherein the second switch has a control node coupled to the control node of the first switch.

11. The amplifier of claim 1, further comprising:
   a digital-to-analog converter circuit configured to convert a digital signal to an analog current supplied to the gate of the second MOS transistor;
   wherein the digital signal has a value set responsive to said binary signal so as to constrain said second MOS transistor to operate as a current source.

12. A radio frequency signal transmission device, comprising:
   an amplifier, said amplifier comprising:
      a first branch comprising an inductor series-connected with a first capacitor between a first node and a second node of application of a direct current (DC) power supply voltage, wherein a junction point of the inductor and the first capacitor forms an output node of the amplifier that is configured to be coupled to a load;
      a second branch comprising a first MOS transistor series-connected with a first switch between the output node the second node, the first switch having a control node coupled to a first input node configured to receive a first input signal, the first MOS transistor having a gate coupled to a second input node configured to receive a second input signal; and a circuit configured to generate a binary signal indicative of a sign of a difference between a drain-source voltage of the first transistor and a gate-source voltage minus a threshold voltage of the first transistor;

a control circuit configured to alternately control the amplifier in:
  a first operating mode where the gate of the first MOS transistor is coupled to the first power supply node and where a frequency-modulated radio frequency signal or phase-modulated radio frequency signal is applied to the first input node; and
  a second operating mode where a radio frequency signal of constant frequency, phase, and amplitude is applied to the first input node and a variable signal for controlling current delivered by the first MOS transistor is applied to the second input node.

13. The radio frequency signal transmission device of claim 12, wherein said circuit comprises:
  a second capacitor and a second switch configured to sample a voltage representative of a voltage at the output node when the first switch is in the on state; and
  a second MOS transistor, of a same type as the first MOS transistor, that is diode-mounted and biased to a conduction threshold, a drain of the second MOS transistor being coupled to a gate of the first MOS transistor.

14. The radio frequency signal transmission device of claim 13, wherein:
  the second capacitor has a first electrode coupled to the second power supply node and a second electrode coupled to the output node by the second switch; and
  a source of the second MOS transistor is coupled to the second power supply node by a current source, and
  further comprising a comparator having a first input coupled to the second electrode of the second capacitor and a second input coupled to the source of the second MOS transistor.

15. The radio frequency signal transmission device of claim 14, wherein said binary signal is an output signal of said comparator.

16. The radio frequency signal transmission device of claim 13, wherein:
  the second capacitor has a first electrode coupled to the second power supply node and a second electrode coupled to a midpoint of a first voltage dividing bridge circuit that couples the output node to the second power supply node; and
  a source of the second MOS transistor is coupled to the second power supply node by a voltage dividing bridge circuit, and
  further comprising a comparator having a first input coupled to the second electrode of the second capacitor and a second input coupled to the midpoint.

17. The radio frequency signal transmission device of claim 16, wherein said binary signal is an output signal of said comparator.

18. A radio frequency signal power amplifier, comprising:
  an inductor coupled between a first power supply node and an output node;
  a first capacitor coupled between the output node and a second power supply node;
  a first MOS transistor coupled between a first intermediate node and the second power supply node;
  where the first MOS transistor has a gate configured to receive a first input signal
  a second MOS transistor coupled between the output node and the first intermediate node;
  wherein the second MOS transistor has a gate configured to receive a second input signal;
  a control circuit configured to apply a voltage at the first power supply node as the second input signal when the radio frequency signal power amplifier is operating to amplify a frequency-modulated radio frequency signal or phase-modulated radio frequency signal that is applied as the first input signal; and
  said control circuit further configured to apply a variable signal as the second input signal when the radio frequency signal power amplifier is operating with a radio frequency signal of constant frequency, phase, and amplitude that is applied as the first input signal.

19. The radio frequency signal power amplifier of claim 18, further comprising a circuit configured to generate a binary signal indicative of a sign of a difference between a drain-source voltage of the first transistor and a gate-source voltage minus a threshold voltage of the first transistor.

20. The radio frequency signal power amplifier of claim 19, further comprising:
  a digital-to-analog converter circuit configured to convert a digital signal to an analog current supplied to the gate of the second MOS transistor;
  wherein the digital signal has a value set responsive to said binary signal so as to constrain said second MOS transistor to operate as a current source while the control circuit applies the variable signal as the second input signal.

* * * * *